(12) United States Patent
Lee et al.

(10) Patent No.: US 8,803,184 B2
(45) Date of Patent: Aug. 12, 2014

(54) ORGANIC LIGHT-EMITTING DISPLAY APPARATUS AND METHOD OF MANUFACTURING THE SAME

(75) Inventors: Jung-Min Lee, Yongin (KR); Jin-Hwan Jeon, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 41 days.

(21) Appl. No.: 13/103,670

(22) Filed: May 9, 2011

(65) Prior Publication Data

US 2011/0303943 A1    Dec. 15, 2011

(30) Foreign Application Priority Data

Jun. 11, 2010  (KR) ................. 10-2010-0055462

(51) Int. Cl.
*H01L 33/00*     (2010.01)
(52) U.S. Cl.
USPC ......... 257/99; 257/100; 257/E33.058; 438/26
(58) Field of Classification Search
USPC .................. 257/99, 100, E33.056, E33.058, 257/E51.001; 438/26, 456; 445/25; 313/512
See application file for complete search history.

(56) References Cited

U.S. PATENT DOCUMENTS

| | | | | |
|---|---|---|---|---|
| 5,751,107 A | * | 5/1998 | Komatsu | 313/496 |
| 6,605,893 B2 | * | 8/2003 | Ando | 313/495 |
| 2006/0290273 A1 | | 12/2006 | Kang et al. | |
| 2007/0007894 A1 | * | 1/2007 | Aitken et al. | 313/512 |
| 2007/0090759 A1 | * | 4/2007 | Choi et al. | 313/512 |
| 2007/0172971 A1 | | 7/2007 | Boroson | |
| 2008/0238318 A1 | * | 10/2008 | Lee et al. | 313/582 |
| 2009/0009063 A1 | | 1/2009 | Botelho et al. | |
| 2009/0104557 A1 | * | 4/2009 | Gao et al. | 430/200 |

FOREIGN PATENT DOCUMENTS

| | | |
|---|---|---|
| KR | 1020060005369 A | 1/2006 |
| KR | 1020070112984 A | 11/2007 |
| KR | 1020080002396 A | 1/2008 |
| KR | 1020090103866 A | 10/2009 |

OTHER PUBLICATIONS

Korean Registration Determination Certificate dated Jan. 29, 2013 issues by KIPO for the corresponding Korean Patent Application No. 10-2010-0055462 with Request for the Entry of the Accompanying Office Action.

* cited by examiner

*Primary Examiner* — Tuan N. Quach
(74) *Attorney, Agent, or Firm* — Robert E. Bushnell, Esq.

(57) ABSTRACT

An organic light-emitting display apparatus capable of preventing permeation of external impurities such as oxygen or water vapor and enhancing impact resistance, and a method of manufacturing the organic light-emitting display apparatus. The organic light-emitting display apparatus includes a first substrate; a display unit disposed on the first substrate; a second substrate disposed over the display unit; and a sealing member by which the first substrate is combined with the second substrate. The sealant includes a first sealant which includes a filler and is spaced apart from the first substrate and the second substrate, and a second sealant which contacts the first substrate and the second substrate and covers at least a part of the first sealant.

23 Claims, 5 Drawing Sheets

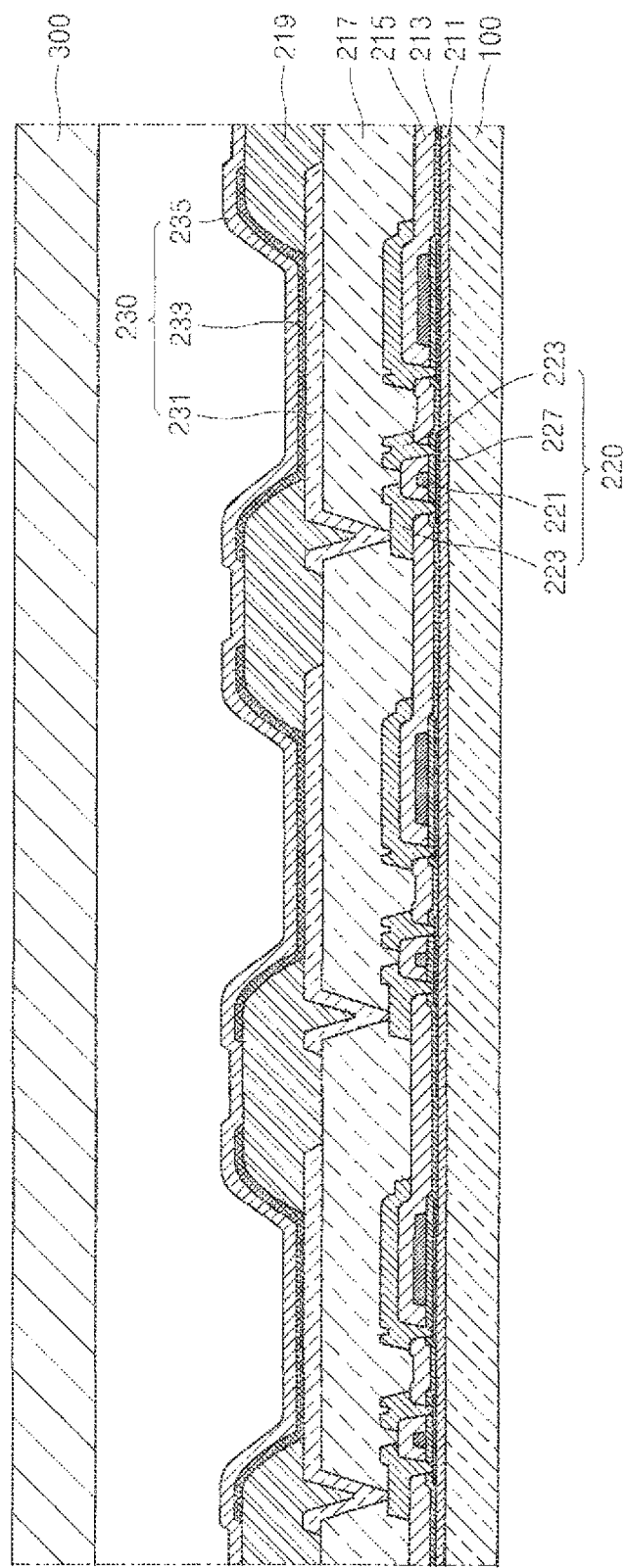

ORGANIC LIGHT-EMITTING DISPLAY APPARATUS AND METHOD OF MANUFACTURING THE SAME

CLAIM OF PRIORITY

This application makes reference to, incorporates the same herein, and claims all benefits accruing under 35 U.S.C. §119 from an application for ORGANIC LIGHT-EMITTING DISPLAY APPARATUS AND METHOD OF MANUFACTURING THE SAME earlier filed in the Korean Intellectual Property Office on 11 Jun. 2010 and there duly assigned Ser. No. 10-2010-0055462.

BACKGROUND OF THE INVENTION

1. Field of the Invention

Aspects of the present invention relate to an organic light-emitting display apparatus and a method of manufacturing the organic light-emitting display apparatus, and more particularly, to an organic light-emitting display apparatus capable of preventing permeation of external impurities such as oxygen or water vapor and a method of manufacturing the organic light-emitting display apparatus.

2. Description of the Related Art

In these days, thin-film portable flat panel display apparatuses are commonly used instead of conventional display apparatuses. Among flat panel display apparatuses, electroluminescent display apparatuses are regarded as a next-generation display apparatus because they are self-emissive display apparatuses and have a wide viewing angle, a high contrast ratio, and a short response time. In addition, organic light-emitting display apparatuses including an emission layer formed of an organic material have a higher brightness, a lower driving voltage, and a shorter response time than inorganic light-emitting, display apparatuses. Furthermore, organic light-emitting display apparatuses can produce a full-color image.

FIG. 1 is a cross-sectional view of a conventional organic light-emitting display apparatus. Referring to FIG. 1, a display unit 20 is disposed on a substrate 10, and an encapsulation substrate 30 is disposed over the display unit 20. The substrate 10 is combined with the encapsulation substrate 30 by using a sealant 41.

A flat panel display device, such as, for example, an organic light-emitting device included in a flat panel display apparatus, easily deteriorates due to internal and external factors. Internal factors include deterioration of an emission layer due to oxygen from indium tin oxide (ITO) used to form an electrode, and deterioration caused by a reaction between an emission layer and an interface of the emission layer and adjacent layers. External factors include permeation of external water vapor, oxygen and ultra violet rays, and device manufacturing conditions. In particular, external water vapor and greatly affect the lifetime of a device. Thus, packaging of an organic light-emitting device is very important.

However, in the conventional organic light-emitting display apparatus as illustrated in FIG. 1, when the substrate 10 is combined with the encapsulation substrate 30 by using a conventional sealant 41, impurities such as external oxygen or water vapor may permeate into the conventional organic light-emitting display apparatus through the interface of the sealant 41 and the encapsulation substrate 30, thereby damaging the display unit 20. In addition, the sealant 41 may easily break by impact.

SUMMARY OF THE INVENTION

Aspects of the present invention provide an organic light-emitting display apparatus capable of preventing permeation of external impurities such as oxygen or water vapor and enhancing impact resistance, and a method of manufacturing the organic light-emitting display apparatus.

According to an aspect of the present invention, there is provided an organic light-emitting display apparatus including: a first substrate; a display unit disposed, on the first substrate; a second substrate disposed over the display unit; and a sealing member by which the first substrate is combined with the second substrate, wherein the sealing member, includes a first sealant which includes a filler and is spaced apart from the first substrate and the second substrate, and a second sealant which contacts the first substrate and the second substrate and covers at least a part of the first sealant.

According to a non-limiting aspect, the first sealant may be accommodated in the second sealant.

According to a non-limiting aspect, a filler may be omitted from the second sealant.

According to a non-limiting aspect, the first sealant may include V—Te or V—W glass frit.

According to a non-limiting aspect, the second sealant may include V—P—B—Zn glass frit.

According to a non-limiting aspect, the first sealant and the second sealant may have substantially the same coefficient of thermal expansion (CTE).

According to a non-limiting aspect, the first sealant and the second sealant may have a CTE of $(30\sim90)*10^{-7}/K$.

According to a non-limiting aspect, the transition temperature and melting temperature of the first sealant may be lower than the transition temperature and melting temperature of the second sealant.

According to a non-limiting aspect, the transition temperature and melting-temperature of the first sealant may be lower than the transition temperature and melting temperature of, the second sealant by about 30~50° C.

According to a non-limiting aspect, the flowability of the first sealant may be poorer than that of the second sealant.

According to another limiting aspect, a trench having a predetermined depth may be formed in a region of the second substrate contacting the sealing member.

According to a non-limiting aspect, at least a part of the second sealant may be accommodated in the trench.

According to another aspect of the present invention, there is provided an organic light-emitting display apparatus including: a first substrate; a display unit disposed on the first substrate; a second substrate disposed over the display unit; a first portion of a second sealant formed on the first substrate and including glass frit, a first sealant formed on the second sealant and including glass frit and a filler; and a second portion of the second sealant formed on the first sealant.

According to a non-limiting aspect, the first portion of the second sealant, the first sealant, and the second portion of the second sealant may be sequentially formed on one surface of the first substrate on which the display unit is disposed.

According to another aspect of the present invention, there is provided a method of manufacturing an organic light-emitting display apparatus, the method including: providing a first substrate having a display unit formed thereon; forming a first portion of a second sealant on one surface of a second substrate; forming a first sealant including a filler on the first portion of the second sealant; forming a second portion of the second sealant on the first sealant; and combining the first substrate with the second substrate such that the first sealant and the first and second portions of the second sealant form a sealing member between the first substrate and the second substrate.

According to a non-limiting aspect, a filler may be omitted from the second sealant.

According to a non-limiting aspect, the forming of the first portion of the second sealant on one surface of the second substrate may include: forming a trench in one surface of the second substrate; and forming the first portion of the second sealant in the trench.

According to a non-limiting aspect, in the forming the first portion of the second sealant in the trench, at least a part of the first portion of the second sealant may be accommodated in the trench.

According to a non-limiting aspect, in the forming of the second portion of the second sealant on the first sealant, the second portion of the second sealant may cover at least a part of the first sealant.

According to a non-limiting aspect, the first sealant may be spaced apart from the first substrate and the second substrate.

According to a non-limiting aspect; the first portion of the second sealant, the first sealant, and the second portion of the second sealant may be sequentially formed on the second substrate.

Additional aspects and/or advantages of the invention will be set forth in part in the description which follows and, in part, will be obvious from the description, or may be learned by practice of the invention.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like-reference symbols indicate the same or similar components, wherein:

FIG. 7 is a partial, schematic cross-sectional view of the organic light-emitting display apparatus of FIG. 2.

DETAILED DESCRIPTION OF THE INVENTION

Figure 1:
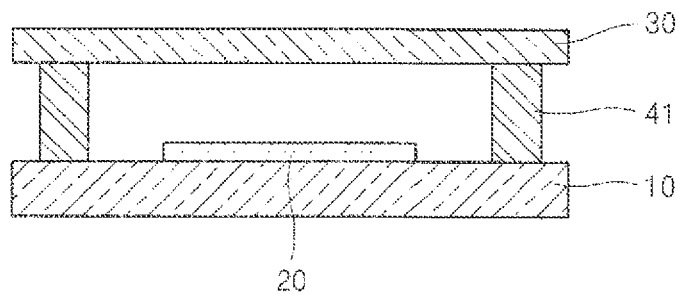
FIG. 1 is a cross-sectional view of a conventional organic light-emitting display apparatus.

Reference will now be made in detail to the present embodiments of the present invention, examples of which are illustrated in the accompanying drawings, wherein like reference numerals refer to the like elements throughout. The embodiments are described below in order to explain aspects of the present invention by referring to the figures.

Figure 2:
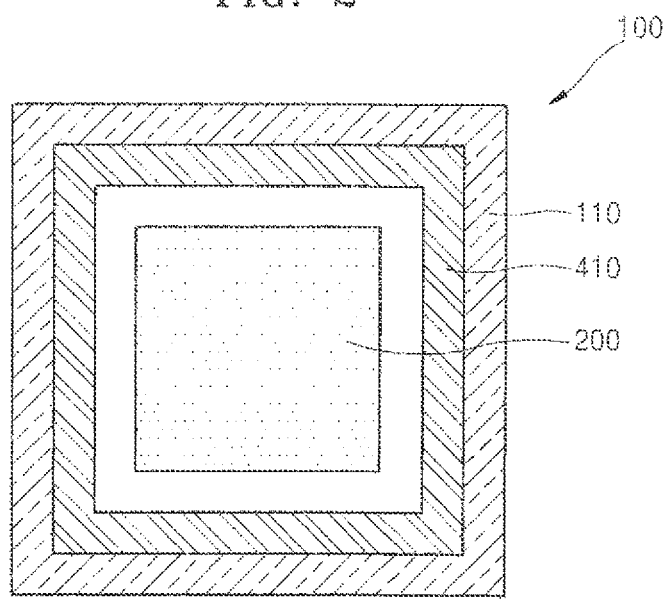
FIG. 2 is a schematic, partial plan view of an organic light-emitting display apparatus according to an embodiment of the present invention.
Figure 3:
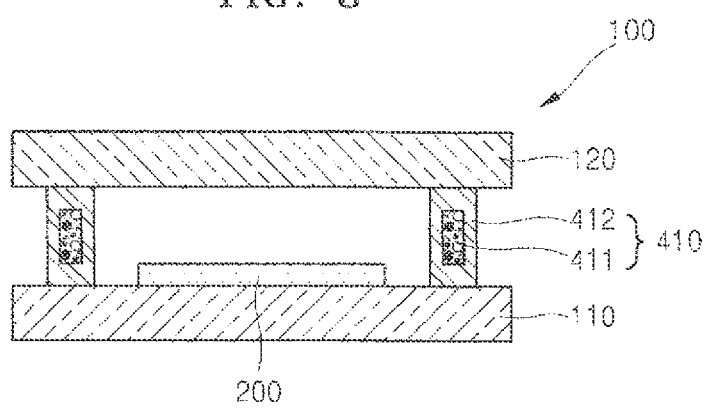
FIG. 3 is a schematic cross-sectional view of the organic light-emitting display apparatus of FIG. 2.

FIG. 2 is a schematic, partial plan view of an organic light-emitting display apparatus 10 according to an embodiment of the present invention, and FIG. 3 is a schematic cross-sectional view of the organic light-emitting display apparatus 10 of FIG. 2. A second substrate 120 included in the organic light-emitting display apparatus 10 of FIG. 3 is not shown in the organic light-emitting display apparatus 10 of FIG. 2.

A display unit 200 including an organic light-emitting device is disposed partially on a first substrate 110.

The first substrate 110 may be formed of a transparent glass material mostly consisting of $SiO_2$. However, the material for forming the first substrate 116 may not be limited thereto. For example, the first substrate 110 may also be formed of a transparent plastic material. The transparent plastic material for forming the first substrate 110 may be an insulating organic material such as polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), or cellulose acetate propionate (CAP).

If the organic light-emitting display apparatus 100 is a bottom emission type organic light-emitting display apparatus, that is, an image is embodied in direction toward the first substrate 110, the first substrate 110 may be formed of a transparent-material. However, if the organic light-emitting display apparatus 100 is a top emission type organic light-emitting display apparatus, that is, a display apparatus in which an image is embodied in a direction opposite to the first substrate 110, it is not necessary that the first substrate 110 be formed of a transparent material. In the latter case, the substrate 100 may be formed of a metal. When the first substrate 110 is formed of a metal, the first substrate 110 may include at least one metal selected from the group consisting of carbon, iron, Chromium, manganese, nickel, titanium, molybdenum, stainless steel (SUS), Invar alloy, Inconel alloy, and Kovar alloy. However, the first substrate 110 may also include other materials. For example, the first substrate 110 may be a metal foil.

Although not illustrated, a buffer layer (not shown) may be further formed on the first substrate 110 so as to planarize the first substrate 110 and to prevent permeation of impurity elements.

The first substrate 110 on which the display unit 200 is formed is combined with the second substrate 120 disposed over the display unit 200. The second substrate 120 may also be a glass substrate or a plastic substrate such as an acryl substrate. Furthermore, the second substrate 120 may be a metal substrate.

The first substrate 110 is combined with the second substrate 120 by using a sealing member 410. The sealing member 410 may include glass frit.

In this regard, the organic light-emitting display apparatus 100 includes the sealing member 410 including a first sealant 411 that includes a filler and is spaced apart from the first substrate 110 and the second substrate 120 by a predetermined gap, and a second sealant 412 that covers at least a part of the first sealant 411 and does not include the filler.

In general, the sealing member 410 may be formed using a glass frit paste. The glass frit paste includes glass powder as a solid content, and a liquid vehicle. The glass powder is a powder prepared by finely milling glass that consists of four or more compounds. The glass powder is dry-milled such that a particle diameter of the glass powder particles is within 20% of the thickness $t_{frit}$ of the sealing member 410 that has been sintered. In general, the thickness $t_{frit}$ is in the range of about 3 to 30 μm. Thus, an average particle diameter of the glass powder particles may be in the range of about 0.6 to about 6 μm.

Meanwhile, since the first substrate 110 and the second substrate 120 included in the organic light-emitting display apparatus 10 are formed of glass having a low coefficient of thermal expansion (CTE) so as to maintain a constant pattern before and after a thermal process, the glass powder used to prepare the glass fit paste also may have a CTE that is similar to those of the first substrate 110 and the second substrate 120.

However, in order to combine the first substrate 110 with the second substrate 120 by locally melting the sealing member 410, the sealing member 410 may be a sealant that melts at low temperature and once melted, smoothly flows and forms a strong mechanical bond between the first substrate 110 and the second substrate 120. A sealant having such features has a high CTE, and a very low impact resistance due to its weak intermolecular bond. That is, even when very small impacts are applied to the sealant the sealant is highly likely to crack.

Thus, such a low impact resistance and a high CTE are compensated for by adding a filler such as ceramic to the glass powder having a high CTE when the glass fit paste is prepared. The filler may be any filler that has a lower CTE than that of the glass powder. For example, the filler may have a negative CTE so as to obtain structural stability therein and a low CTE. The addition of the filler to the glass powder may improve mechanical properties such as Young's modulus, fracture toughness, etc. Meanwhile, the inclusion of the filler in the sealing member 410 may otherwise result in destruction of a product when the product is dropped and stress focuses on the filler, although mechanical properties of the product is improved.

However, when the filler is added to the glass powder, flowability rapidly deteriorates. In more detail, since the glass transition temperature $T_g$ of the glass frit paste is lower than those of the first substrate 110 and the second substrate 120, no chemical bond is formed between interfaces of the first substrate 110 and the second substrate 120 and the glass frit paste, a mechanical bond is formed in the interfaces in which molecules of the glass frit paste hold molecules of the first substrate 110 and the second substrate 120. High flow ability is desirable to smoothly form the mechanical bond. Addition of the filter to the glass powder results in a rapid deterioration of flowability.

As a result, it may be desirable to add a filler to the glass frit paste so as to compensate for a low impact resistance and a high CTE and improve mechanical properties, but at the same time, it may be undesirable to add a filler to the glass frit paste because of poorer flowability.

To solve such problem, the sealing member 410 of the organic light-emitting display apparatus 100 of the present embodiment has a vertically stacked multi-layer structure. In more detail, the first sealant 411 including the filler is disposed at the center of the sealing member 410, i.e., a part of the sealing member 410 that does not contact the first substrate 110 and the second substrate 120, thereby compensating for a low impact resistance and a high CTE and improving mechanical properties of the sealing member 410. Further, the second sealant 412 that does not include the filler is disposed at a part of the sealing member 410 that contacts the first substrate 110 and the second substrate 120, which improves flowability, thereby smoothly forming the mechanical bond between the first substrate 110 and the second substrate 120 and the sealing member 410.

In this regard, the first sealant 411 including the filler may be combined with special fillers having a negative CTE and glass powder so as to obtain structural stability and, a low CTE, and a ratio (about up to 50%) of fillers with respect to the glass powder is increased, thereby further enhancing mechanical properties. In this case, the CTE of the glass powder, may be within a range of about $(70~200)*10^{-7}/K$. By mixing a predetermined amount of fillers and the glass powder, the CTE of the first sealant 411 may be finally as small as possible within a range of about $(30~90)*10^{-7}/K$. A material used to form the first sealant 411 may be V—Te or V—W glass frit.

Meanwhile, the second sealant 412 that does not include the filler may be formed of a material having a CTE that is somewhat similar to the CTE (about $(35~45)*10^{-7}/K$) of the first substrate 110 and the second substrate 120. That is, the CTE of the second sealant 412 may be as small as possible within a range of about $(30~90)*10^{-7}/K$. Such material is weak in the mechanical properties and is excellent in flowability as described above. The material used to form the second sealant 412 may be V—P—B—Zn glass frit.

The material used to form the first sealant 411 and the material used to form the second sealant 412 have a substantially similar CTE (about $50*10^{-7}/K$) in order to prevent a crack from occurring due to a residual stress between the first sealant 411 and the second sealant 412 when the first sealant 411 and the second sealant 412 are combined with each other.

The characteristics of the materials used to form the first sealant 411 and the second sealant 412 are compared to each other below.

The glass transition temperature $T_g$ and melting temperature $T_m$ of the material used to form the first sealant 411 may to be slightly lower, for example, about 30~50° C., than those of the material used to form the second sealant 412. The reason is that the material used to form the second sealant 412 is melted later than the material used to form the first sealant 411 and is hardened earlier than the material used to form the first sealant 411 when the first sealant 411 and the second sealant 412 are sintered. The material used to form the second sealant 412 is melted later than the material used to form the sealant 411, so that binder and solvent residues of the material used to form the first sealant 411 form pores and escape therethrough, and the pores are filled with the second sealant 412 having excellent flowability. Further, the material used to form the second sealant 412 is hardened earlier than the material used to form the first sealant 411 so that the filler included in the material used to form the first sealant 411 does not permeate the second sealant 412. That is, the filler is prevented from contacting the first substrate 110 and the second substrate 120.

The first sealant 411 includes the filler, and thus the flowability of the second sealant 412 is better than that of the first sealant 411. Thus, the second sealant 412 that, contacts the first substrate 110 and the second substrate 120 may have a flat and smooth surface.

The first sealant 411 includes the filler, and thus mechanical properties such as Young's modulus, fracture toughness, etc. of the first sealant 411 are better than those of the second sealant 412.

The first substrate 110 and the second substrate 120 and the sealing member 410 that contact each other have a similar CTE, thereby preventing a crack from occurring due to a residual stress. The flowability of the second sealant 412 that directly contacts the first substrate 110 and the second substrate 120 is improved, thereby smoothly forming the mechanical bond between the first substrate 110 and the second substrate 120 and the sealing member 410 and improving planarization and uniformity of interfaces between the first substrate 110 and the second substrate 120 and the sealing Member 410. The first sealant 411 having an excellent mechanical rigidity owing to its inclusion of the filler is disposed at the center of the sealing member 410, thereby preventing deformation due to impacts. Furthermore, the first sealant 411 including the filler is accommodated in the second sealant 412 so that the filler does not directly contact the first substrate 110 and the second substrate 120, thereby enhancing impact resistance.

Figure 4:
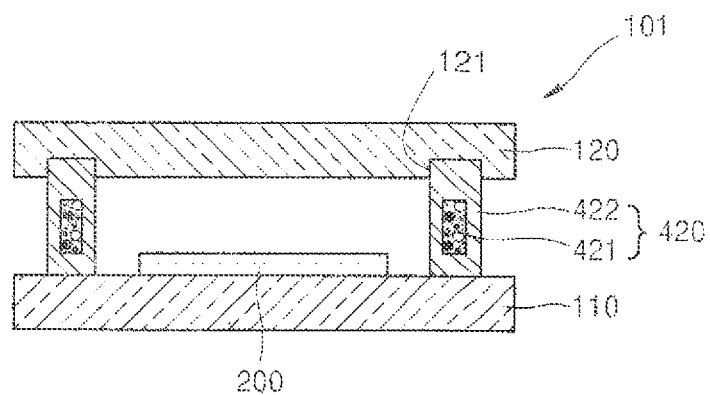
FIG. 4 is a schematic, partial plan view of an organic light-emitting display apparatus according to another embodiment of the present invention.

FIG. 4 is a schematic, partial plan view of an organic light-emitting display apparatus 101 according to another embodiment of the present invention. Referring to FIG. 4, the organic light-emitting display apparatus 101 of the present embodiment includes the first substrate 110, the display unit 200, the second substrate 120, and a sealing member 420. The organic light-emitting display apparatus 101 of the present embodiment in which a trench 121 having a predetermined depth is formed in a region of the second substrate 120 contacting the sealing member 420 is different from the organic light-emitting display apparatus 100 of the previous embodiment.

In more detail, the trench 121 having a predetermined depth is formed in the second substrate 120 in order to prevent an optical Newton Ring from being generated due to a differential pressure caused by an increase in the thickness of the sealing member 420. After the trench 121 having a predetermined depth is formed in the second substrate 120, a second sealant 422 and a first sealant 421 are sequentially formed in the trench 121, which reduces a gap between the first substrate 110 and the second substrate 120, thereby preventing the optical Newton Ring from being generated.

Figure 5:
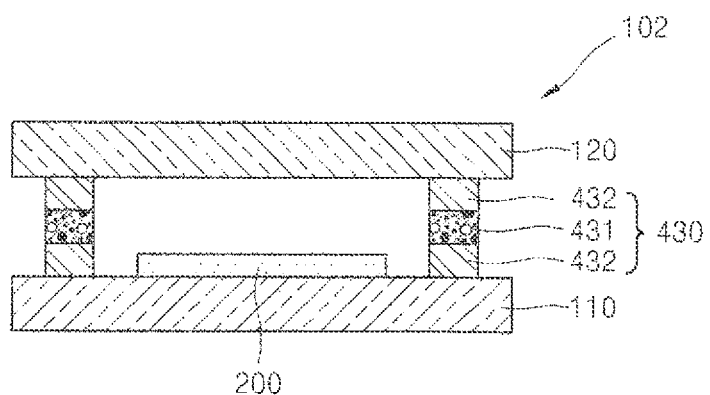
FIG. 5 is a schematic, partial plan view of an organic light-emitting display apparatus according to another embodiment of the present invention.

FIG. 5 is a schematic, partial plan view of an organic light-emitting display apparatus 102 according to another embodiment of the present invention. Referring to FIG. 5, the organic light-emitting display apparatus 102 of the present embodiment includes the first substrate 110, the display unit 200, the second substrate 120, and a sealing member 430. The organic light-emitting display apparatus 102 of the present embodiment in which a first sealant 431 is not accommodated in the second sealant 432, and in which a first portion of the second sealant 432, the first sealant 431, and a seconds portion of the second sealant 432' are sequentially formed on the first substrate 110 is different from the organic light-emitting display apparatuses 100 and 101 of the previous embodiments. Thus, the organic light-emitting display apparatus 102 of the present embodiment is easily manufactured.

FIGS. 6A through 6E are schematic, cross-sectional views explaining a method of manufacturing an organic light-emitting display apparatus according to an embodiment of the present invention. Referring to FIGS. 6A through 6E, the method of manufacturing the organic light-emitting display apparatus includes forming a display unit on one surface of a first substrate or providing a first substrate having a display unit formed thereon, forming a trench in one surface of a second substrate, forming a first portion of a second sealant in the trench, forming a first sealant including a filler on the first portion of the second sealant, forming a second portion of the second sealant on the first sealant, and combining the first substrate with the second substrate such that the first sealant and the second sealant form a sealing member between the first substrate and the second substrate.

The display unit 200 is formed or provided on one surface of the first substrate 110. The material of the first substrate 110 may selected from a variety of plastic substrates and a glass substrate as well, and further a metal plate. A buffer layer (not shown) may be further formed on the first substrate 110.

Figure 6A:
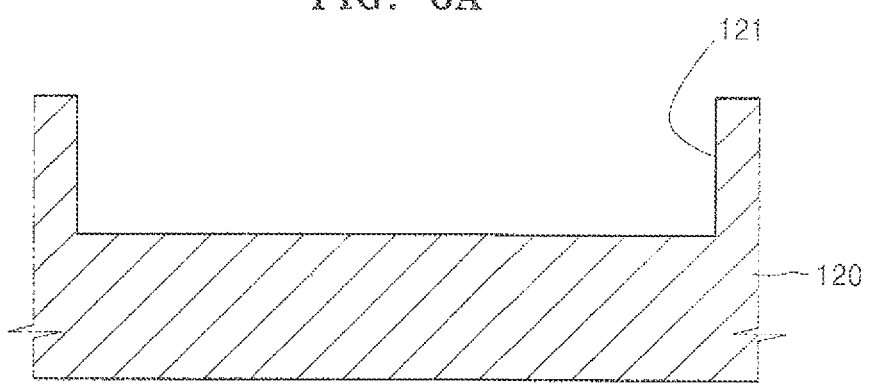
FIGS. 6A through 6E are schematic, cross-sectional views explaining a method of manufacturing an organic light-emitting display apparatus according to an embodiment of the present invention.

As illustrated in FIG. 6A, the trench 121 is formed in one surface of the second substrate 120. In more detail, the trench 121 having a predetermined depth is formed in a region of the second substrate 120 that will contact the subsequently formed sealing, member 420 in order to prevent an optical Newton Ring from being generated due to a differential pressure caused by an increase in the thickness of the sealing member 420. The trench 121 reduces a gap between the first substrate 110 and the second substrate 120, thereby preventing the optical Newton Ring from being generated.

Figure 6B:
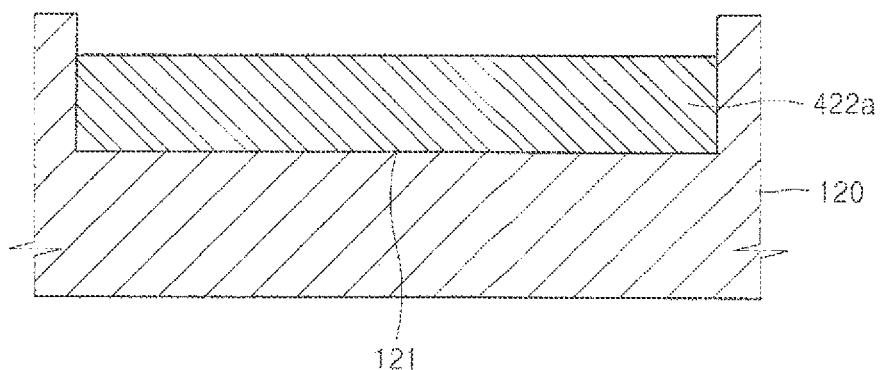

As illustrated in FIG. 6B, a first portion 422a of a second sealant is formed in the trench 121. That is at least a part of the first portion 422a of the second sealant is accommodated in the trench 121. A sealant material that does not include a filler is used as the second sealant as described above, which improves flowability, thereby smoothly forming a mechanical bond between the first substrate 110 and the second substrate 120 and the sealing member 420.

Figure 6C:
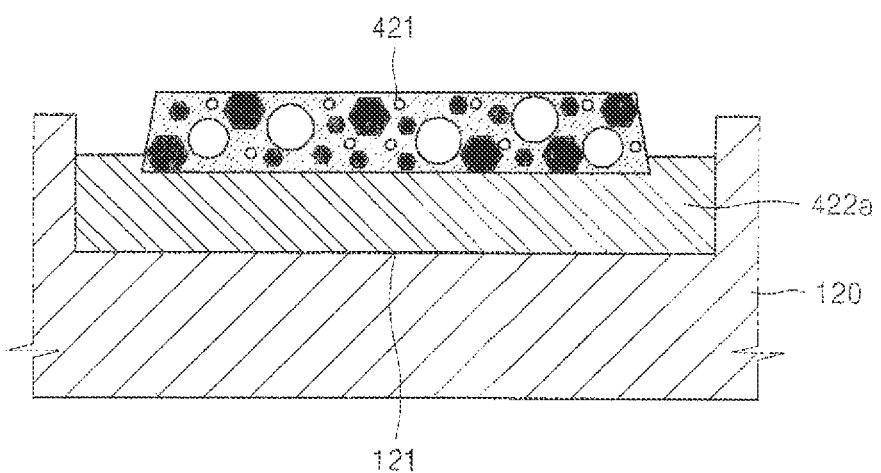

As illustrated in FIG. 6C, the first sealant 421 including a filler is formed on the first portion of the second sealant 422a. A sealant material that includes the filler is used as the first sealant 421 as described above, thereby compensating for a low impact resistance and a high CTE and improving mechanical properties of the sealing member 420.

Figure 6D:
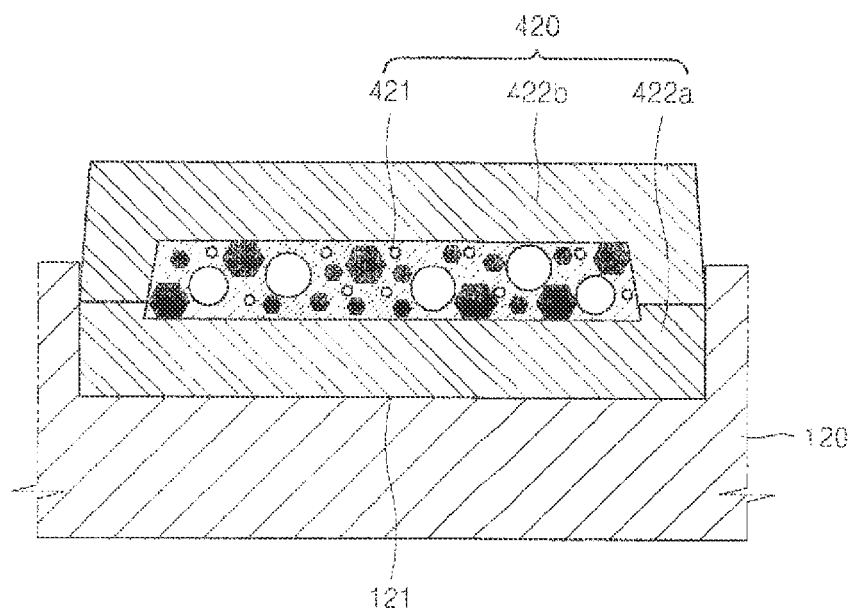

As illustrated in FIG. 6D, a second portion 422b of the second sealant is formed on the first sealant 421 to cover the first sealant 421. The second portion 422b of the second sealant may be formed to cover at least a part of the first sealant 421. As, described above, a sealant material that does not include the filler is used as the second sealant, which improves flowability, thereby smoothly forming the mechanical bond between the first substrate 110 and the second substrate 120 and the sealing member 420.

Figure 6E:
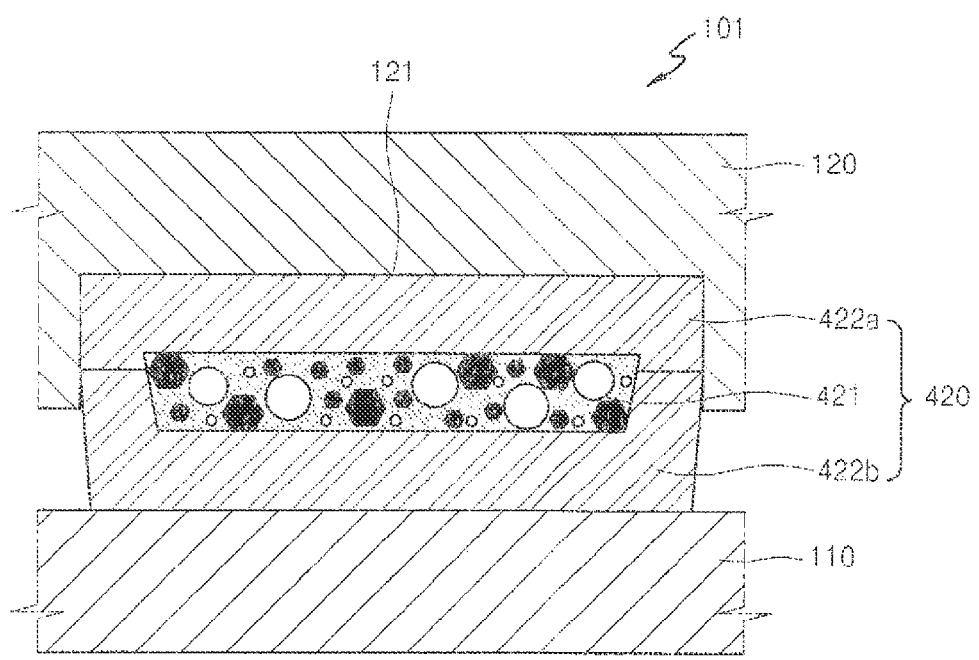

As illustrated in FIG. 6E, the first, substrate 110 and the second substrate 120 are combined with each other such that first sealant 421 and the second sealant 422a, 422b for the sealing member 420 between the first substrate 110 and the second substrate 120. That is, the first substrate 110 and the second substrate 120 are combined with each other by hardening the sealant 410 using a method of locally irradiating laser to the sealing member 420 by using a laser irradiator, etc.

In the present embodiment, the first substrate 110 and the second substrate 120 and the sealing member 420 that contact each other have a similar CTE, thereby preventing a crack from occurring due to a residual stress. The flowability of the second sealant 422 that directly contacts the first substrate 110 and the second substrate 120 is improved, thereby smoothly forming the mechanical bond between the first substrate 110 and the second substrate 120 and the sealing member 420 and improving planarization and uniformity of interfaces between the first substrate 110 and the second substrate 120 and the sealing member 420. The first sealant 421 having an excellent mechanical rigidity owing to its inclusion of the filler is disposed at the center of the sealing member 420, thereby preventing deformation due to impacts. Furthermore, the first sealant 421 including the filler is accommodated in the second sealant 422 so that the filler does not directly contact the first substrate 110 and the second substrate 120, thereby enhancing impact resistance.

FIG. 7 is a partial, schematic cross-sectional view of the organic light-emitting display apparatus of FIG. 2, exemplarily illustrating a detailed structure of the display unit 200. It is to be understood that the display unit 200 is not limited to what is described herein, and that any encapsulatable display unit may be used.

Referring to FIG. 7, a plurality of thin film transistors (TFTs) 220 are formed on the first substrate 110, and an organic light-emitting device 230 is formed on each of the TFTs 220. The organic light emitting device 230 may include a pixel electrode 231 electrically connected to the TFT 220, an opposite electrode 235 disposed above a surface of the first substrate 110, and an intermediate layer 233 that is interposed between the pixel electrode 231 and the opposite electrode 235 and includes at least an emission layer.

The TFT 220 formed on the first substrate 110 may include a gate electrode 221, source electrode and drain electrodes 223, a semiconductor layer 227, a gate insulating layer 213, and an inter-insulating layer 215. The structure of the TFTs 220 is not limited to the structure illustrated in FIG. 4. For example, the TFT 220 may also be an organic TFT including the semiconductor layer 227 formed of an organic material, or a silicon TFT including the semiconductor layer 227 formed of silicon. If necessary, a buffer layer 211 formed of silicon oxide or silicon nitride may be further formed between the TFT 220 and the first substrate 110.

The organic light-emitting device 23G may include the pixel electrode 231 and the opposite electrode 235 which face each other, and the intermediate layer 233 that is interposed between the pixel electrode 231 and the opposite electrode 235 and is formed of an organic material. The intermediate layer 233 may include at least an emission layer. For example, the intermediate layer 233 may include a plurality of layers, which will be described later.

The pixel electrode 231 functions as an anode, and the opposite electrode 235 functions as a cathode. In another embodiment, the pixel electrode 231 functions as a cathode, and the opposite electrode 235 functions as an anode.

The pixel electrode 231 may be a transparent electrode or a reflective electrode. If the pixel electrode 231 is a transparent electrode, the pixel electrode 231 may be formed of ITO, IZO, ZnO, or $In_2O_3$, and if the pixel electrode 231 is a reflective electrode, the pixel electro'de 231 may include a reflective film formed of Ag, Mg, Al, Pt, Pd, Au, Ni, Nd, Ir, Cr, or a mixture thereof and a film formed of ITO, IZO, ZnO, or $In_2O_3$.

The opposite electrode 235 may also be a transparent electrode or a reflective electrode. If the opposite electrode 235 is a transparent electrode, the opposite electrode 235 may include a film that is formed of Li, Ca, LiF/Ca, LiF/Al, Al, Mg, or a mixture thereof and faces the intermediate layer 233 between the pixel electrode 231 and the opposite electrode 235, and an auxiliary electrode or bus electrode line formed on the film; wherein the auxiliary electrode or bus electrode line may be formed of a transparent electrode material such as ITO, IZO, ZnO or $In_2O_3$. If the opposite electrode 235 is a reflective electrode, the opposite electrode 235 may be formed by depositing Li, Ca, LiF/Ca, LiF/Al, Al, Mg, or a mixture thereof.

Meanwhile, a pixel-defining layer (PDL) 219 covers edges of the pixel electrode 231 and has a given thickness outside the pixel electrode 231. The PDL 219 defines an emission region, and widens a distance between the pixel electrode 231 and the opposite: electrode 235 in a direction toward the edges of the pixel, electrode 231 so as to prevent formation of a strong electric field at the edges of the pixel electrode 231, thereby preventing short-circuits of the pixel electrode 231 and the opposite electrode 235.

Between the pixel electrode 231 and the opposite electrode 235, the intermediate layer 233 including at least an emission layer is formed. The structure of the intermediate layer 233 may vary. The intermediate layer 233 may be formed of a low molecular weight organic material or a polymer, organic material.

When the intermediate layer 233 is formed of a low molecular weight organic material, the intermediate layer 233 may include an organic emission layer (EML) and at least one layer selected from the group consisting of a hole injection layer (HIL), a hole transport layer (HTL), an emission layer, an electron transport layer (ETL), and an electron injection layer (EIL), wherein each layer may be a single layer or multi-layered. In this regard, an available low molecular weight organic material may be copper phthalocyanine (CuPc), N,N'-dinaphthalene-1-yl-N,N'-diphenyl-benzidine (NPB), or tris-8-hydroxyquinoline aluminum (Alq3). These low molecular weight organic materials may be used in, for example, a deposition process using masks.

When the intermediate layer 233 is formed of a polymer organic material, generally, the intermediate layer 233 may have an HTL and an EML, and the HTL may be formed of PEDOT and the EML may be formed of a polymer material selected from poly-phenylenevinylenes (PPV) and polyfluorenes.

The organic light-emitting device 230 may be electrically connected to the TFT 220 disposed therebelow. In this regard, if a planarization layer 217 covering the TFT 220 is included, the organic light-emitting device 230 may be disposed on the planarization layer 217, and the pixel electrode 231 of the organic light-emitting device 230 may be electrically connected to the TFT 220 through a contact hole formed in the planarization layer 217.

The organic light-emitting device 230 formed on, the first substrate 110 is sealed by the second substrate 120. As described above, the second Substrate 120 may be formed of a variety of materials, such as glass, a plastic material, etc.

The organic light-emitting display apparatuses and methods of manufacturing, the organic light-emitting display apparatuses according to embodiments of the present invention are capable of preventing permeation of external impurities such as oxygen or water vapor and enhancing impact resistance.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light-emitting display apparatus comprising:
a first substrate;
a display unit disposed on the first substrate;
a second substrate disposed over the display unit; and
a sealing member by which the first substrate is combined with the second substrate, wherein the sealing member comprises a first sealant spaced apart from the first substrate and the second substrate, and a second sealant which contacts the first substrate and the second substrate and covers at least a part of the first sealant, wherein only the first sealant comprises a filler, wherein the first sealant has improved mechanical properties including improved Young's modulus improved fracture toughness and improved impact resistance over that of the second sealant by including the filler only within the first sealant and not within the second sealant, while the second sealant having improved flowability and improved planarization and uniformity with the interfaces of the first and second substrates than that of the first sealant by the second sealant being absent of filler.

2. The organic light-emitting display apparatus of claim 1, wherein the first sealant is entirely arranged within the second sealant.

3. The organic light-emitting display apparatus of claim 1, wherein the first sealant comprises V—Te or V—W glass frit.

4. The organic light-emitting display apparatus of claim 3, wherein the second sealant comprises V—P—B—Zn glass frit.

5. The organic light-emitting display apparatus of claim 1, wherein the first sealant and the second sealant have substantially the same coefficient of thermal expansion (CTE).

6. The organic light-emitting display apparatus of claim 1, wherein the first sealant and the second sealant have a CTE of $(30\sim90)*10^{-7}/K$.

7. The organic light-emitting display apparatus of claim 1, wherein the transition temperature and melting temperature of the first sealant are lower than the transition temperature and melting temperature of the second sealant by about 30~50°C.

8. The organic light-emitting display apparatus of claim 1, wherein a trench having a predetermined depth is formed in a region of the second substrate contacting the sealing member.

9. The organic light-emitting display apparatus of claim 8, wherein at least a part of the second sealant is accommodated in the trench.

10. The organic light-emitting display apparatus of claim 1, wherein the sealing member is hardened by locally irradiating the first sealant and the second sealant.

11. The organic light-emitting display apparatus of claim 1, wherein the second sealant has better flowability than the first sealant such that the second sealant flows to form a mechanical bond with the first substrate and the second substrate upon the sealing member being cured by radiation.

12. The organic light-emitting display apparatus of claim 1, wherein a transition temperature and melting temperature of the first sealant are lower than a transition temperature and melting temperature of the second sealant such that the first sealant melts before the second sealant to form pores and some of the second sealant fills the pores of the first sealant upon the sealing member being cured by radiation.

13. The organic light-emitting display apparatus of claim 1, wherein each of the first and second sealants comprise and glass frit comprised of a glass powder having an average particle diameter in the range of 0.6 to 6 microns.

14. The organic light-emitting display apparatus of claim 1, wherein each of the first and second sealants has a glass transition temperature $T_g$ that is less than that of each of the first and second substrates.

15. The organic light-emitting display apparatus of claim 1, where in the glass transition temperature $T_g$ and the melting temperature $T_m$ of the first sealant is about 30 to 50 Celsius degrees less than that of the second sealant.

16. The organic light-emitting display apparatus of claim 1, wherein the sealing member melts at a lower temperature than that of either of the first and second substrates.

17. The organic light-emitting display apparatus of claim 1, wherein the second sealant within pores of the first sealant.

18. The organic light-emitting display apparatus comprising:
a first substrate;
a display unit disposed on the first substrate;
a second substrate disposed over the display unit; and
a sealing member by which the first substrate is combined with the second substrate,
wherein the sealing member comprises a first sealant which includes a filler and is spaced apart from the first substrate and the second substrate, and a second sealant which contacts the first substrate and the second substrate and covers at least a part of the first sealant,
wherein the second sealant does not contain a filler,
wherein the first sealant has improved mechanical properties including improved impact resistance over that of the second sealant by including the filler only within the first sealant and not within the second sealant, while the second sealant having improved flowability and improved planarization and uniformity with the interfaces of the first and second substrates than that of the first sealant by the second sealant being absent of the filler.

19. The organic light-emitting display apparatus of claim 18, wherein the first sealant has improved mechanical properties, including improved Young's modulus and fracture toughness over that of the second sealant.

20. An organic light-emitting display apparatus comprising:
a first substrate;
a display unit disposed on the first substrate;
a second substrate disposed over the display unit;
a first portion of a second sealant formed on the first substrate and comprising glass frit,
a first sealant formed on the first portion of the second sealant and comprising glass frit and a filler; and
a second portion of the second sealant formed on the first sealant,
wherein only the first sealant comprises a filler;
wherein the first sealant has improved mechanical properties including improved Young's modulus, improved fracture toughness, and improved impact resistance over that of the second sealant by including the filler only within the first sealant and not within the second sealant, while the second sealant having improved flowability and improved planarization and uniformity with the interfaces of the first and second substrates than that of the first sealant by the second sealant being absent of the filler.

21. The organic light-emitting display apparatus of claim 20, wherein the first portion of the second sealant, the first sealant, and the second portion of the second sealant are sequentially formed on one surface of the first substrate on which the display unit is disposed.

22. The organic light-emitting display apparatus of claim 20, wherein a trench having a predetermined depth is formed in a region of the second substrate contacting the second sealant.

23. The organic light emitting display apparatus of claim 22, wherein at least a part of the second sealant is accommodated within the trench.

* * * * *